US008604822B2

(12) United States Patent
Schroeder et al.

(10) Patent No.: US 8,604,822 B2
(45) Date of Patent: Dec. 10, 2013

(54) METHODS AND APPARATUS FOR TESTING ELECTRIC POWER DEVICES

(75) Inventors: Stefan Schroeder, Bavaria (DE); Cyrus David Harbourt, Roanoke, VA (US); Jie Shen, Bayern (DE)

(73) Assignee: General Electric Company, Niskayuna, NY (US)

( * ) Notice: Subject to any disclaimer, the term of this patent is extended or adjusted under 35 U.S.C. 154(b) by 453 days.

(21) Appl. No.: 12/956,785

(22) Filed: Nov. 30, 2010

(65) Prior Publication Data

US 2012/0133389 A1 May 31, 2012

(51) Int. Cl.
*G01R 31/40* (2006.01)

(52) U.S. Cl.
USPC ...... 324/764.01; 324/765; 324/768; 324/769; 324/762.08; 324/158.1; 363/39; 363/21.1; 363/100

(58) Field of Classification Search
USPC .................................................... 324/764.01
See application file for complete search history.

(56) References Cited

U.S. PATENT DOCUMENTS

| 6,775,160 | B2 | 8/2004 | Siri | |
|---|---|---|---|---|
| 7,405,553 | B1 | 7/2008 | Kattoju | |
| 7,486,099 | B1 | 2/2009 | Manika | |
| 2003/0090257 | A1* | 5/2003 | Howes | 324/127 |
| 2008/0186741 | A1 | 8/2008 | Rabo | |
| 2009/0107256 | A1* | 4/2009 | Jensen | 73/862 |
| 2010/0164735 | A1 | 7/2010 | Hartman et al. | |
| 2010/0308857 | A1* | 12/2010 | Saniter et al. | 324/764.01 |

* cited by examiner

*Primary Examiner* — Arleen M Vazquez
*Assistant Examiner* — Son Le
(74) *Attorney, Agent, or Firm* — Andrew J. Caruso (57) ABSTRACT

A method of assembling a testing apparatus for a full-power converter assembly includes coupling an electric power supply apparatus to an electric power grid. The method also includes coupling a direct current (DC) generation apparatus to the electric power supply apparatus. The method further includes coupling an electric power grid simulation device to the DC generation apparatus. The method also includes coupling a full-power converter assembly test connection to the electric power grid simulation device.

16 Claims, 7 Drawing Sheets

METHODS AND APPARATUS FOR TESTING ELECTRIC POWER DEVICES

BACKGROUND

The subject matter described herein relates generally to electric power device testing and, more particularly, to methods and apparatus for testing full-power converter assemblies.

At least some known full-power converter assemblies, or power converters, are electrically tested up to their predetermined electrical ratings prior to shipping from a manufacturing facility to an installation site. One such test is typically referred to as a "full-power test". Such full-power testing verifies performance of each power converter at their rated capacities. Smaller power converters, i.e., those power converters rated for 500 kilowatts (kW) or less are typically tested with testing apparatus that includes a full-power transformer, a full-power circuit breaker, and appropriately sized variable test loads that include motors with an adjustable brake and/or variable load resistor banks. However, for larger power converters in excess of 500 kW, the size and costs of the testing apparatus increases commensurately. Further, for those power converters with full-power ratings in excess of 2 megawatts (MW), including those power converters with power ratings in excess of 10 MW, the larger testing apparatus is expensive to purchase, install, and maintain, requires a large physical footprint, and may be unwieldy to position for testing power converters of varying sizes.

Also, at least some known power converter testing apparatus is typically electrically coupled to a local utility grid to supply the necessary testing power. However, not all such utility grids are sufficiently powered to support large-scale power converter testing. For example, utility grid connections in remote areas may not have the necessary voltage stability and may not have the necessary sustained current supply capabilities. Moreover, bulk power purchasing from a utility on a transient basis may be expensive and may require coordination with the associated utility such that the utility can be prepared to support the large transient electrical loads that full-power converter testing will likely entail.

Further, many known power converter testing apparatus include a "point of common coupling" that transmits electric power into the testing apparatus and receives at least some of the output power from the testing apparatus. Some testing procedures typically include testing power converters at electrical frequencies that may not be consistent with local grid frequencies. For example, a power converter designed for a 50 Hertz (Hz) frequency, as is common in Europe, is difficult to test with a 60 Hz North American grid. Grid operating requirements typically restrict harmonic frequencies transmitted thereon. Therefore, grid isolation equipment that may include expensive filters may be required to support test activities of power converters.

BRIEF DESCRIPTION OF THE INVENTION

In one aspect, a method of assembling a testing apparatus for a full-power converter assembly is provided. The method includes coupling an electric power supply apparatus to an electric power grid. The method also includes coupling a direct current (DC) generation apparatus to the electric power supply apparatus. The method further includes coupling an electric power grid simulation device to the DC generation apparatus. The method also includes coupling a full-power converter assembly test connection to the electric power grid simulation device.

In another aspect, a testing apparatus for a full-power converter assembly is provided. The testing apparatus includes a utility grid electric power supply apparatus. The testing apparatus also includes a direct current (DC) generation apparatus coupled to the utility grid electric power supply apparatus. The testing apparatus further includes an electric power grid simulation device coupled to the DC generation apparatus. The testing apparatus also includes a full-power converter assembly test connection coupled to the electric power grid simulation device.

In yet another aspect, a method of testing a full-power converter assembly is provided. The method includes coupling a full-power converter assembly to an electric power supply test connection. The method also includes coupling the full-power converter assembly to a test load. The method further includes coupling the electric power supply test connection to a direct current (DC) power supply link. The method also includes recirculating electric power from the test load to the full-power converter assembly.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

Unless otherwise indicated, the drawings provided herein are meant to illustrate key inventive features of the invention. These key inventive features are believed to be applicable in a wide variety of systems comprising one or more embodiments of the invention. As such, the drawings are not meant to include all conventional features known by those of ordinary skill in the art to be required for practice of the invention.

DETAILED DESCRIPTION OF THE INVENTION

In the following specification and the claims, which follow, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The exemplary systems and methods described herein overcome disadvantages of known power converter testing apparatus by providing a testing apparatus that simulates a utility grid electric power supply to the power converter being tested. Specifically, the power converter testing apparatus includes a direct current (DC) link between an alternating current (AC) source and an AC test supply device that simulates a utility grid electric power supply to the apparatus being tested. Also, specifically, the power converter testing apparatus recirculates electric power in an internal loop rather than through a second utility grid connection, thereby eliminating the second utility grid connection. Further, specifically, the power converter testing apparatus uses the single utility grid connection to merely transmit initial testing power and to replenish electric power that has dissipated in the electric power recirculation loop. Therefore, using the single utility grid connection merely as an initial and make-up power source facilitates a reduction in the size of otherwise large electric power transmission devices, such as, electric power transformers and utility grid isolation circuit breakers. Also, use of a single utility grid connection facilitates a reduction in the number of such electric power transformers and utility grid isolation circuit breakers. Moreover, since the power converter testing apparatus eliminates recirculating electric power back to the utility grid, the apparatus facilitates a reduction of induced electrical disturbances to the utility grid, such as, induced harmonics, thereby facilitating a reduction in the size and number of filtering equipment interfacing the utility grid and the testing apparatus. Furthermore, since the apparatus is substantially isolated from the utility grid, testing the power converters using a range of frequencies, voltages, and power factors is facilitated.

Figure 1:
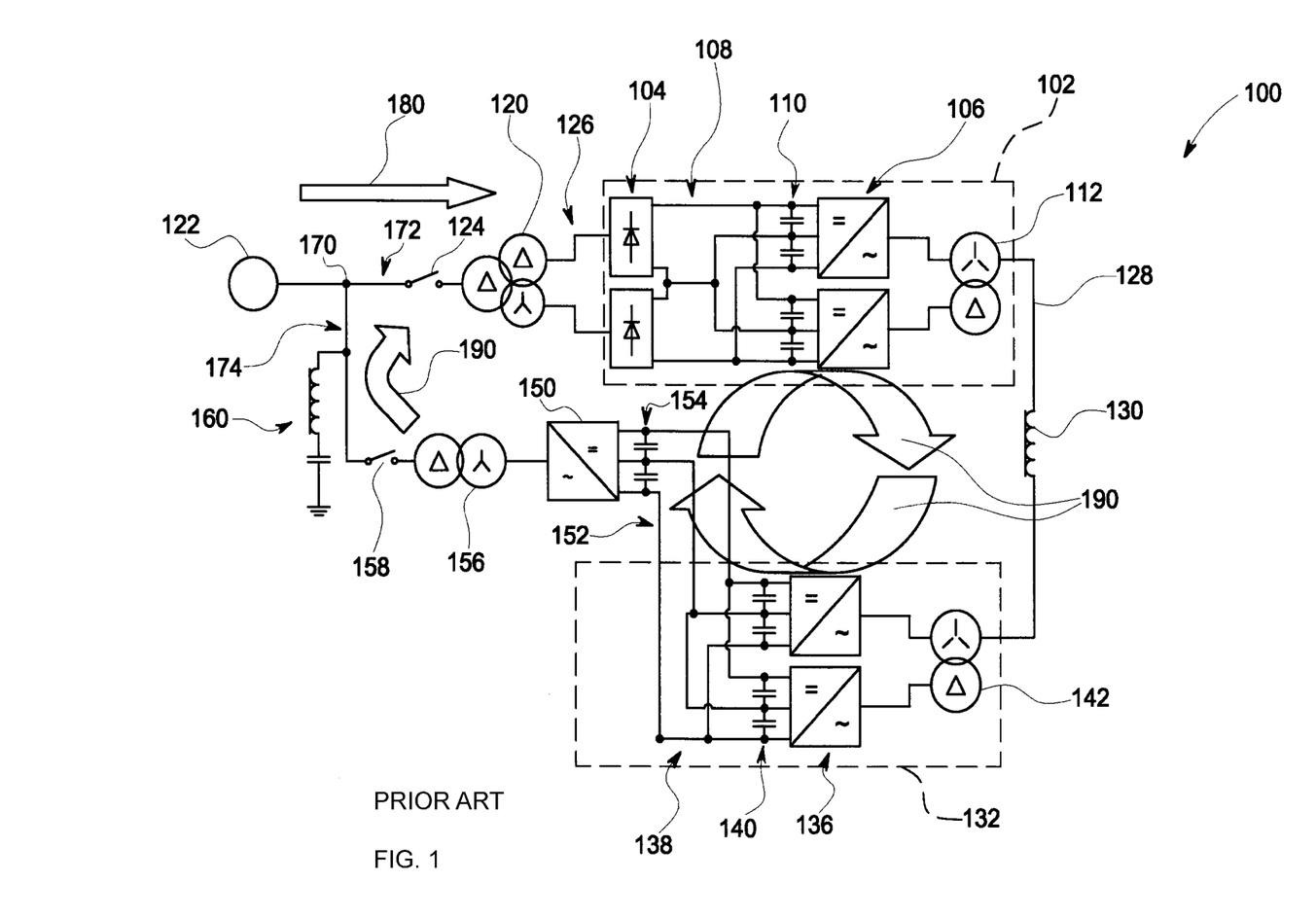
FIG. 1 is a schematic view of a prior art full-power converter assembly testing apparatus.

FIG. 1 is a schematic view of a prior art full-power converter assembly testing apparatus 100. Testing apparatus 100 is configured to test a full-power converter assembly 102. Assembly 102 includes a rectifier portion 104 coupled to a high-frequency inverter portion 106 via a direct current (DC) link 108 that includes at least one capacitive device 110. In the exemplary embodiment, DC link 108 includes a plurality of capacitive devices 110. Assembly 102 also includes a power transformer 112 coupled to inverter portion 106. In the exemplary embodiment, inverter portion 106 is a three-level inverter, therefore assembly 102 is a three-level converter. Alternatively, inverter 106 is a two-level inverter or any multi-level inverter that enables operation of testing apparatus 100 as described herein. As used hereon, the terms "inverter" and "converter" are used to describe any inverter and converter that enables operation of testing apparatus 100 as described herein.

Prior art full-power converter assembly testing apparatus 100 includes a power transformer 120 coupled to an electric power grid 122 via a circuit breaker 124 (shown in an open position) coupled to rectifier portion 104 of full-power converter assembly 102 via a first test connection 126. Typically, power transformer 120 is a step-down transformer. Also, typically, both circuit breaker 124 and power transformer 120 are rated for the full-rated load of assembly 102. Testing apparatus 100 also includes a second test connection 128 coupled to transformer 112. Testing apparatus 100 further includes a high-frequency inductive coupling device ($L_{hf}$) 130 coupled to second test connection 128. Testing apparatus 100 also includes a variable frequency drive (VFD) 132 coupled to $L_{hf}$ 130. VFD 132 includes a DC link 138 that includes a plurality of capacitive devices 140. VFD 132 also includes a power transformer 142 coupled to $L_{hf}$ 130. Power transformer 142 is typically a step-down transformer.

Testing apparatus 100 further includes an active front end (AFE) 150 coupled to VFD 132 via a DC link 152 that includes a plurality of capacitive devices 154. Testing apparatus 100 also includes a power transformer 156 coupled to AFE 150. Power transformer 156 is typically a step-up transformer. Testing apparatus 100 further includes a circuit breaker 158 (shown in an open position) coupling grid 122 to power transformer 156. Also, typically, both circuit breaker 158 and power transformer 156 are rated for the full-rated load of assembly 102. Testing apparatus 100 also includes an inductive-capacitive filtering device 160 coupled to grid 122, circuit breaker 124, and circuit breaker 158. Testing apparatus 100 further includes a point of common coupling (POCC) 170 that is defined by a coupling of an input section 172 of testing apparatus 100 and an output section 174 of testing apparatus 100.

In operation, circuit breakers 124 and 158 are in a closed position (both are shown in an open position in FIG. 1) and electric power grid 122 is coupled to input section 172 and output section 174 of testing apparatus 100. Alternating current (AC) (not shown) is transmitted from grid 122 at a predetermined grid AC voltage, and a substantially consistent frequency, to power transformer 120 as shown by current directional arrow 180. Power transformer 120 receives the AC current at the grid AC voltage, steps-down the AC voltage and steps-up the AC electric current, and transmits AC electric current at a predetermined value and a predetermined AC voltage via first test connection 126 to rectifier portion 104 of full-power converter assembly 102 being tested. Rectifier portion 104 receives the AC current at the AC voltage and rectifies such electric power to a predetermined DC current having a predetermined DC voltage. The DC current is transmitted through DC link 108 to high-frequency inverter portion 106, wherein capacitive devices 110 facilitate smoothing of the associated DC voltage. Inverter portion 106 converts the received DC current at the DC voltage to an AC current at a predetermined AC voltage and a predetermined AC frequency with a predetermined real-to-reactive power ratio. The converted AC power is transmitted from inverter portion 106 to power transformer 112, wherein transformer 112 steps-up the voltage and steps-down the current to predetermined values. In general, electric power transmitted from full-power converter assembly 102 is at least occasionally at approximately rated, or near rated, full power conditions. While tested by testing apparatus 100, assembly 102 is typically operated to vary an output voltage within a range that may extend from 0 to 6 kilovolts (kV) and an output frequency within a range that may extend from 0 to 600 Hertz (Hz). Some assemblies 102 may be tested specifically at grid-rated frequency, typically 50 Hz or 60 Hz, depending on the shipping destination of assembly 102.

Also, in operation, AC electric power is transmitted from full-power converter assembly 102 to VFD 132 via second test connection 128 and $L_{hf}$ 130, wherein $L_{hf}$ 130 facilitates filtering high frequency harmonic distortions from the AC electric power transmitted to power transformer 142. Power transformer 142 receives the transmitted, filtered AC current at the transmitted and filtered AC voltage, steps-down the filtered AC voltage and steps-up the filtered AC electric current, and transmits AC electric current to a predetermined value and a predetermined AC voltage to high-frequency inverter portion 136. Inverter portion 136 receives the AC current at the AC voltage transmitted from power transformer 142 and converts the AC power to a predetermined DC current having a predetermined DC voltage while simulating a predetermined loading on assembly 102. The converted DC power is transmitted to AFE 150 via DC links 138 and 152, wherein capacitive devices 140 and 154 facilitate smoothing the transmitted DC power.

Further, in operation, AFE 150 receives the DC power transmitted from high-frequency inverter portion 136 and converts the received DC current at the DC voltage to an AC current at a predetermined AC voltage and a predetermined AC frequency with a predetermined real-to-reactive power ratio. In general, electric power transmitted from AFE 150 has a frequency at or near electric power grid 122 frequency. The AC power is transmitted from AFE 150 to power transformer 156, wherein transformer 156 steps-up the AC voltage and steps-down the AC current for transmission to POCC 170 via circuit breaker 158 and output section 174. Such AC power is approximately at rated grid voltage. Inductive-capacitive filtering device 160 facilitates filtering harmonic distortions from the AC power transmitted to POCC 170 to reduce a potential for harmonic distortions being transmitted to electric power grid 122, and for meeting grid total harmonic distortion (THD) standards imposed by local regulatory authorities and/or the owner/operator of grid 122. However, while being at least effective in meeting such standards, such filtering may not remove all harmonic distortions.

Moreover, in operation, prior art full-power converter assembly testing apparatus 100 recirculates electric power therethrough as shown by power recirculation arrows 190. While the majority of electric power is recirculated within testing apparatus 100, at least a portion of electric power is transmitted back into electric power grid 122, with at least some harmonic distortions therein, and at least a portion of electric power dissipated within testing apparatus 100 is restored via electric power grid 122. Furthermore, in operation, voltages, currents, and frequencies are controlled via at least some manual and at least some automated modulation of assembly 102, VFD 132, and AFE 150 using associated control devices (none shown). Upon completion of testing, assembly 102, VFD 132, and AFE 150 are modulated to reduce the amount of electric power recirculating within until circuit breakers 124 and 158 are opened and remaining power within testing apparatus 100 is dissipated into heat energy.

Figure 2:
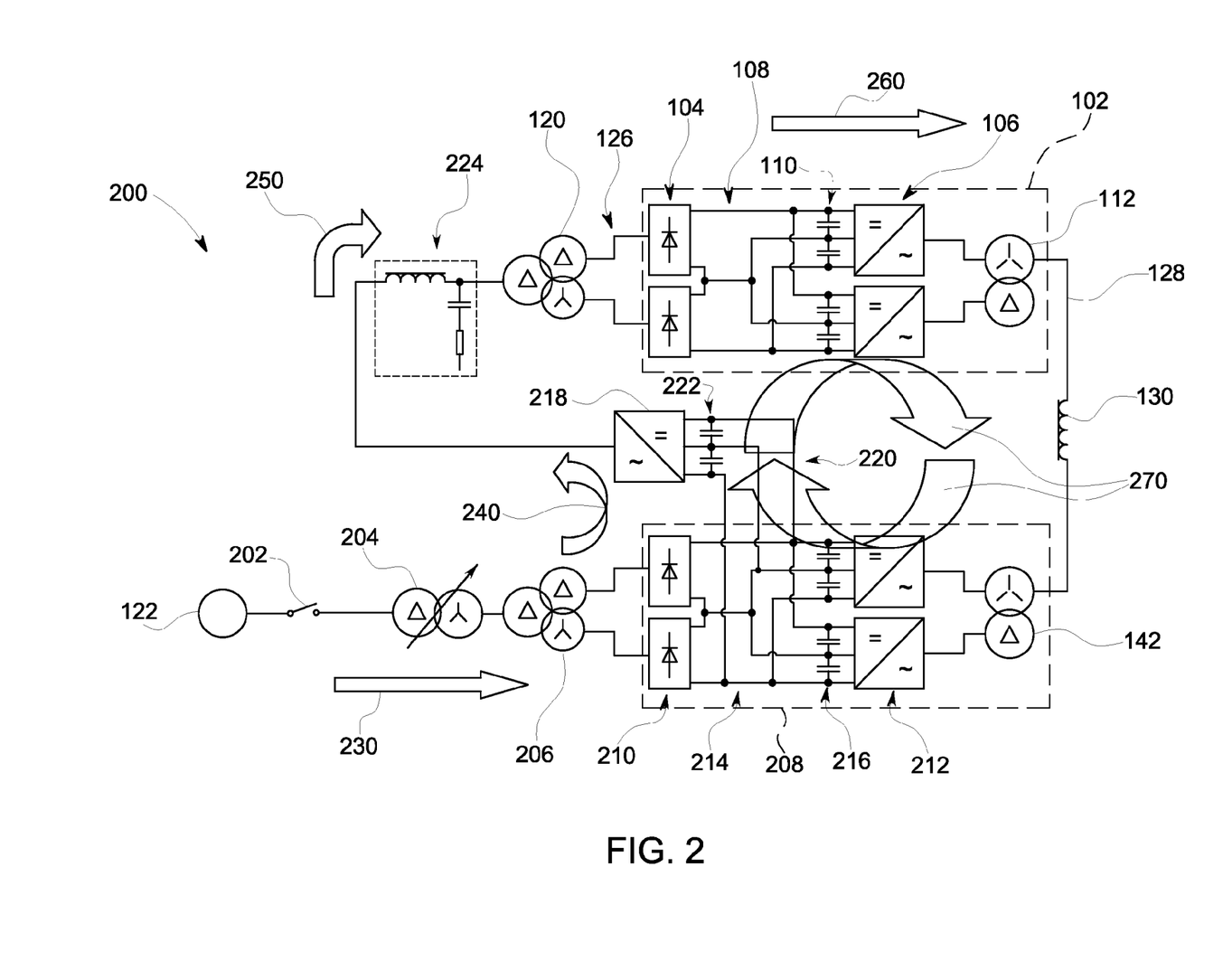
FIG. 2 is a schematic view of an exemplary full-power converter assembly testing apparatus.

FIG. 2 is a schematic view of an exemplary full-power converter assembly testing apparatus 200 that may be used instead of testing apparatus 100 (shown in FIG. 1). In the exemplary embodiment, testing apparatus 200 includes a grid circuit breaker 202 (shown in the open position) coupled to electric power grid 122. Circuit breaker 202 has rated power transmission parameters less than those of circuit breaker 124 (described further below). Testing apparatus 200 also includes a voltage modulation device 204 coupled to circuit breaker 202. In the exemplary embodiment, voltage modulation device 204 is a variac unit. Such variac unit includes a variable ratio transformer that includes a substantially continuous, high-resolution tap changing device that further includes at least one remotely-controlled drive device operably coupled thereto (neither shown).

Testing apparatus 200 further includes a power transformer 206 coupled to optional voltage modulation device 204 that is similar to power transformer 120, however, transformer 206 has rated power transmission parameters less than of power transformer 120 (also described further below). Testing apparatus 200 also includes a variable frequency test drive (VFTD) 208 that is similar to VFD 132 (shown in FIG. 1) and coupled to power transformer 206. VFTD 208 includes a rectifier portion 210 coupled to a high-frequency inverter portion 212 via a DC link 214 that includes a plurality of capacitive devices 216. However, in the exemplary embodiment, power transformer 206 is coupled to rectifier portion 210.

Testing apparatus 200 also includes an AFE 218 coupled to DC link 214 of VFTD 208 via a DC link 220 and a plurality of capacitive devices 222. AFE 218 is substantially similar to AFE 150 (shown in FIG. 1). Testing apparatus 200 further includes an optional low pass filter (LPF) unit 224 coupled to AFE 218. Testing apparatus 200 also includes power transformer 120, first test connection 126, second test connection 128, $L_{hf}$ 130, and power transformer 142. Moreover, full-power converter assembly 102 is coupled to first test connection and second test connection 128.

Testing apparatus 200 does not include a POCC 170 coupling an input section 172 with an output section 174 (all shown in FIG. 1). In the exemplary embodiment, apparatus 200 includes a single connection with electric power grid 122 via grid circuit breaker 202. Therefore, power converter testing apparatus 200 recirculates electric power in an internal loop rather than through a second utility grid connection, thereby eliminating the second utility grid connection, i.e., output section 174 and POCC 170. Power converter testing apparatus 200 uses the single utility grid connection at circuit breaker 202 to merely transmit initial testing power and to replenish electric power that has dissipated in the electric power recirculation loop.

Therefore, using the single utility grid connection at circuit breaker 202 as an initial and make-up power source facilitates elimination of some large electric power transmission devices, such as, circuit breaker 158 and power transformer 156 (both shown in FIG. 1) and a reduction in the size of otherwise large electric power transmission devices. For example, without limitation, circuit breaker 202 may have rated power transmission parameters less than those of circuit breaker 124 (shown in FIG. 1) and power transformer 206 may have rated power transmission parameters less than those of power transformer 120. Moreover, since power converter testing apparatus 200 eliminates recirculating electric power back to grid 122, testing apparatus 200 facilitates a reduction of induced electrical disturbances to grid 122, such as, induced harmonics, thereby facilitating a reduction in the size and number of filtering equipment interfacing grid 122 and testing apparatus 200, i.e., inductive-capacitive filtering device 160 (shown in FIG. 1). Such elimination of unnecessary equipment, reductions in size of remaining equipment, and elimination of power transfer from testing apparatus 200 into grid 122 facilitate a reduction in dissipated and otherwise wasted energy, thereby facilitating an increase in efficiency of testing apparatus 200 over that of testing apparatus 100.

In operation, grid circuit breaker 202 is in a closed position (shown in an open position in FIG. 2) and electric power grid 122 is coupled to voltage modulation device 204 of testing apparatus 200. Alternating current (AC) (not shown) is transmitted from grid 122 at a predetermined grid AC voltage, and a substantially consistent frequency, to power transformer 206 via voltage modulation device 204 as shown by a power directional arrow 230. Voltage modulation device 204 is locally or remotely operated to adjust a tap changer about the variable ratio transformer therein to finely adjust an incoming AC voltage and AC current that is transmitted to power transformer 206. Power transformer 206 receives the AC current at the adjusted AC voltage, steps-down the AC voltage and steps-up the AC current, and transmits AC current at a predetermined value and a predetermined AC voltage to rectifier portion 210 of VFTD 208. Rectifier portion 210 receives the AC current at the AC voltage and rectifies such electric power to a predetermined DC current having a predetermined DC voltage. The DC current, as shown by a power directional arrow 240, is transmitted through DC link 220 to AFE 218, wherein capacitive devices 222 facilitate smoothing the transmitted DC power.

Also, in operation, AFE 218 receives the DC power transmitted from rectifier portion 210 and converts the received DC current at the DC voltage to an AC current at a predetermined AC voltage and a predetermined AC frequency with a predetermined real-to-reactive power ratio. In general, electric power transmitted from AFE 218 has a frequency range such that the frequency may be varied to simulate input frequencies from a plurality of devices that include, without limitation, wind turbine generators (not shown). The AC power is transmitted from AFE 218 to LPF unit 224, as shown by power directional arrow 250, wherein LPF unit 224 filters (or, chops) higher-frequency harmonics from the transmitted AC power. In some alternative embodiments, LPF unit 224 is not used because AFE 218 is configured to transmit AC power therefrom with little to no higher-frequency harmonics therein.

Further, in operation, the AC power having the filtered AC voltages and currents is transmitted from LPF unit 224 to power transformer 120. Power transformer 120 receives the AC current at the filtered AC voltage, steps-down the AC voltage and steps-up the AC electric current, and transmits AC electric current at a predetermined value and a predetermined AC voltage via first test connection 126 to rectifier portion 104 of full-power converter assembly 102 being tested. Rectifier portion 104 receives the AC current at the AC voltage and rectifies such electric power to a predetermined DC current having a predetermined DC voltage. The DC current is transmitted through DC link 108 to high-frequency inverter portion 106, as shown by a power directional arrow 260, wherein capacitive devices 110 facilitate smoothing of the associated DC voltage. Inverter portion 106 converts the received DC current at the DC voltage to an AC current at a predetermined AC voltage and a predetermined AC frequency with a predetermined real-to-reactive power ratio. The converted AC power is transmitted from inverter portion 106 to power transformer 112, wherein transformer 112 steps-up the voltage and steps-down the current to predetermined values. While tested by testing apparatus 200, assembly 102 is typically operated to vary an output voltage within a range that may extend from 0 to 6 kV and an output frequency within a range that may extend from 0 to 600 Hz. Some assemblies 102 may be tested specifically at grid-rated frequency, typically 50 Hz or 60 Hz, depending on the shipping destination of assembly 102.

Moreover, in operation, AC electric power is transmitted from full-power converter assembly 102 to VFTD 208 via second test connection 128 and $L_{hf}$ 130, wherein $L_{hf}$ 130 facilitates filtering high frequency harmonic distortions from the AC electric power transmitted to power transformer 142. Power transformer 142 receives the transmitted, filtered AC current at the transmitted, filtered AC voltage, steps-down the filtered AC voltage and steps-up the filtered AC electric current, and transmits AC electric current to a predetermined value and a predetermined AC voltage to high-frequency inverter portion 212. Inverter portion 212 receives the AC current at the AC voltage transmitted from power transformer 142 and converts the AC power to a predetermined DC current having a predetermined DC voltage while simulating a predetermined loading on assembly 102. The converted DC power is transmitted via recirculation to AFE 218 via DC links 214 and 220, wherein capacitive devices 216 and 222 facilitate smoothing the transmitted DC power.

As used herein, the term "loading" may include, without limitation, actual loading of the full-power conversion assembly being tested with a driven electo-mechanical apparatus and/or an emulated electro-mechanical loading via a variable frequency drive device, both as described herein.

Also, in operation, full-power converter assembly testing apparatus 200 recirculates electric power therethrough as shown by power recirculation arrows 270. As testing apparatus 200 is ramped up to full operating loads, electric power is pulled in from electric power grid 122. Substantially all of the electric power is recirculated within testing apparatus 200, while at least a portion of the electric power is dissipated as heat energy. Substantially none of the recirculating electric power is transmitted back into electric power grid 122, however, makeup electric power is transmitted into testing apparatus 200 from grid 122 with at least a portion of electric power dissipated within testing apparatus 200 restored via electric power grid 122. Furthermore, in operation, voltages, currents, and frequencies are controlled via at least some manual and at least some automated modulation of assembly 102, VFTD 208, AFE 218, and voltage modulation device 204 using associated control devices (none shown). Upon completion of testing, assembly 102, VFTD 208, AFE 218, and voltage modulation device 204 are modulated to reduce the amount of electric power recirculating within and to substantially reduce electric power transmitted into testing apparatus 200 from electric power grid 122 until circuit breaker 202 is opened and remaining recirculating power is dissipated into heat energy.

In operation, testing apparatus 200 simulates a utility grid electric power supply to the power converter being tested, i.e., apparatus 102. Specifically, power converter testing apparatus 200 includes DC link 220 between AC source, i.e., inverter portion 212 and AC test supply device, i.e., AFE 218 that simulates electric power grid 122. Therefore, power converter testing apparatus 200 recirculates electric power in an internal loop rather than through a second utility grid connection, thereby eliminating the second utility grid connection, i.e., output section 174 and POCC 170. Power converter testing apparatus 200 uses the single utility grid connection at circuit breaker 202 to merely transmit initial testing power into testing apparatus 200 and to replenish electric power that has dissipated therein. Moreover, since power converter testing apparatus 200 eliminates recirculating electric power back to grid 122, apparatus 200 facilitates a reduction of induced electrical disturbances to grid 122, such as, induced harmonics.

Figure 3:
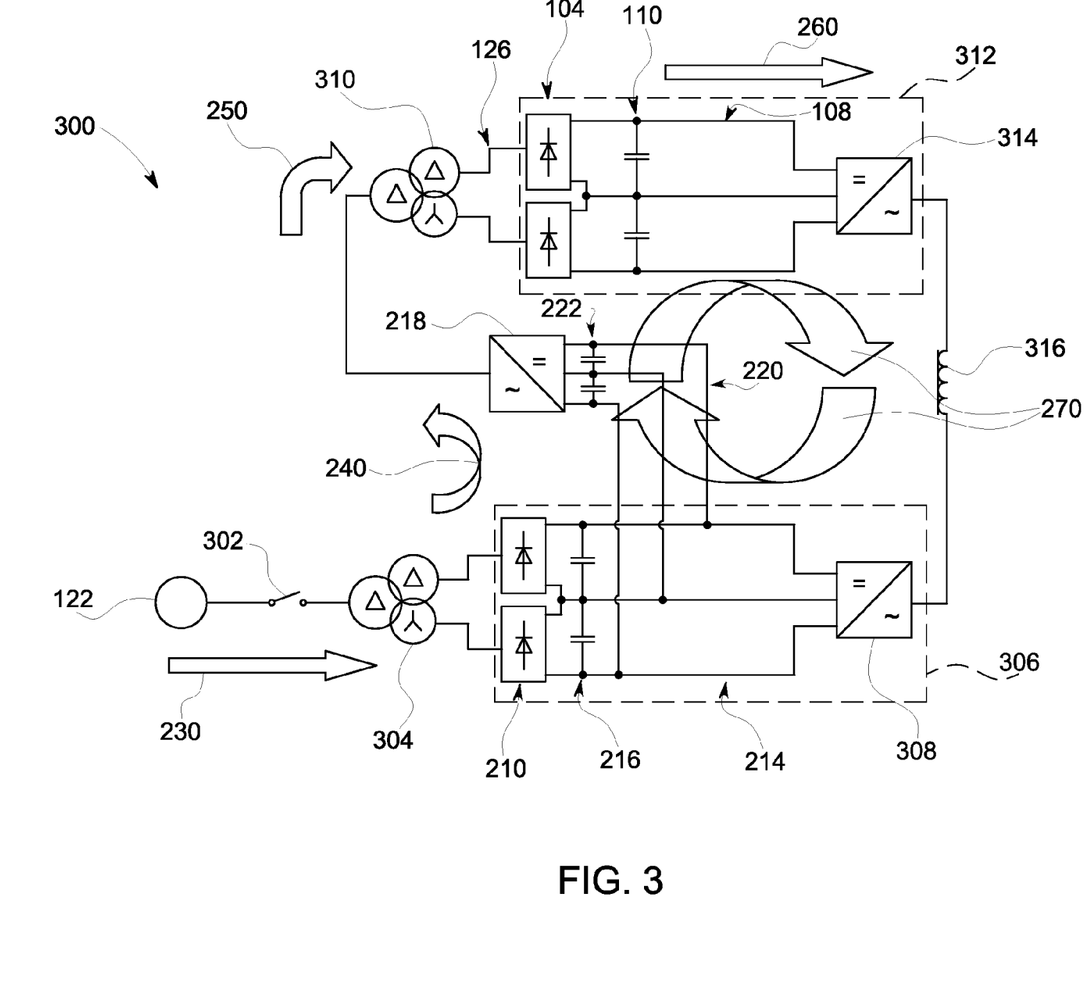
FIG. 3 is a schematic view of an alternative full-power converter assembly testing apparatus.

FIG. 3 is a schematic view of an alternative full-power converter assembly testing apparatus 300. Testing apparatus 300 is similar to testing apparatus 200 (shown in FIG. 2) with the exception that testing apparatus 300 is more suitable for low-frequency testing as compared to testing apparatus 200 that is more suitable for high-frequency testing. Specifically, testing apparatus 300 is more suitable for testing the associated assemblies within a voltage range of 0 to 3 kV and a frequency range of 0 to 100 Hz, wherein testing apparatus 200 is more suitable for testing the associated assemblies within a voltage range of 0 to 6 kV and a frequency range of 0 to 600 Hz.

In this exemplary alternative embodiment, testing apparatus 300 includes a grid circuit breaker 302 (shown in the open position) coupled to electric power grid 122. Testing apparatus 300 also includes a power transformer 304 coupled to grid circuit breaker 302. Testing apparatus 300 further includes a variable frequency test drive (VFTD) 306 coupled to power transformer 304. VFTD 306 is similar to VFTD 208 (shown in FIG. 2) with the exception that VFTD 306 includes a low-frequency inverter portion 308 in contrast to high-frequency inverter portion 212 (shown in FIG. 2). In this alternative exemplary embodiment, rectifier portion 210, DC link 214, and capacitive devices 216 are substantially similar to those related devices associated with testing apparatus 200.

Testing apparatus 300 also includes AFE 218 coupled to DC link 214 of VFTD 306 via DC link 220 and plurality of capacitive devices 222. Testing apparatus further includes a power transformer 310 coupled to AFE 218. Power transformer 310, AFE 218, DC link 220, and capacitive devices 222 are substantially similar to the related devices associated with testing apparatus 200.

A full-power converter assembly 312 is positioned within testing apparatus 300 and coupled therein via first test connection 126 and second test connection 128. In this alternative exemplary embodiment, assembly 312 is similar to assembly 102 (shown in FIG. 2) with the exception that assembly 312 includes a low-frequency inverter portion 314 in contrast to high-frequency inverter portion 106 (shown in FIG. 2). In this alternative exemplary embodiment, rectifier portion 104, DC link 108, and capacitive devices 110 are substantially similar to devices associated with testing apparatus 200. Assembly 312 is coupled to VFTD 306 via a low-frequency inductive coupling device $L_{lf}$ 316.

Testing apparatus 300 differs from testing apparatus 200 by eliminating optional LPF unit 224, voltage modulation device 204, power transformer 112, and power transformer 142. Operation of testing apparatus 300 is similar to operation of testing apparatus 200. Alternatively, some embodiments of testing apparatus 300 may include an optional LPF unit similar to LPF unit 224 (shown in FIG. 2). Also, alternatively, some embodiments of testing apparatus 300 may include a voltage modulation device similar to voltage modulation device 204 (shown in FIG. 2).

Figure 4:
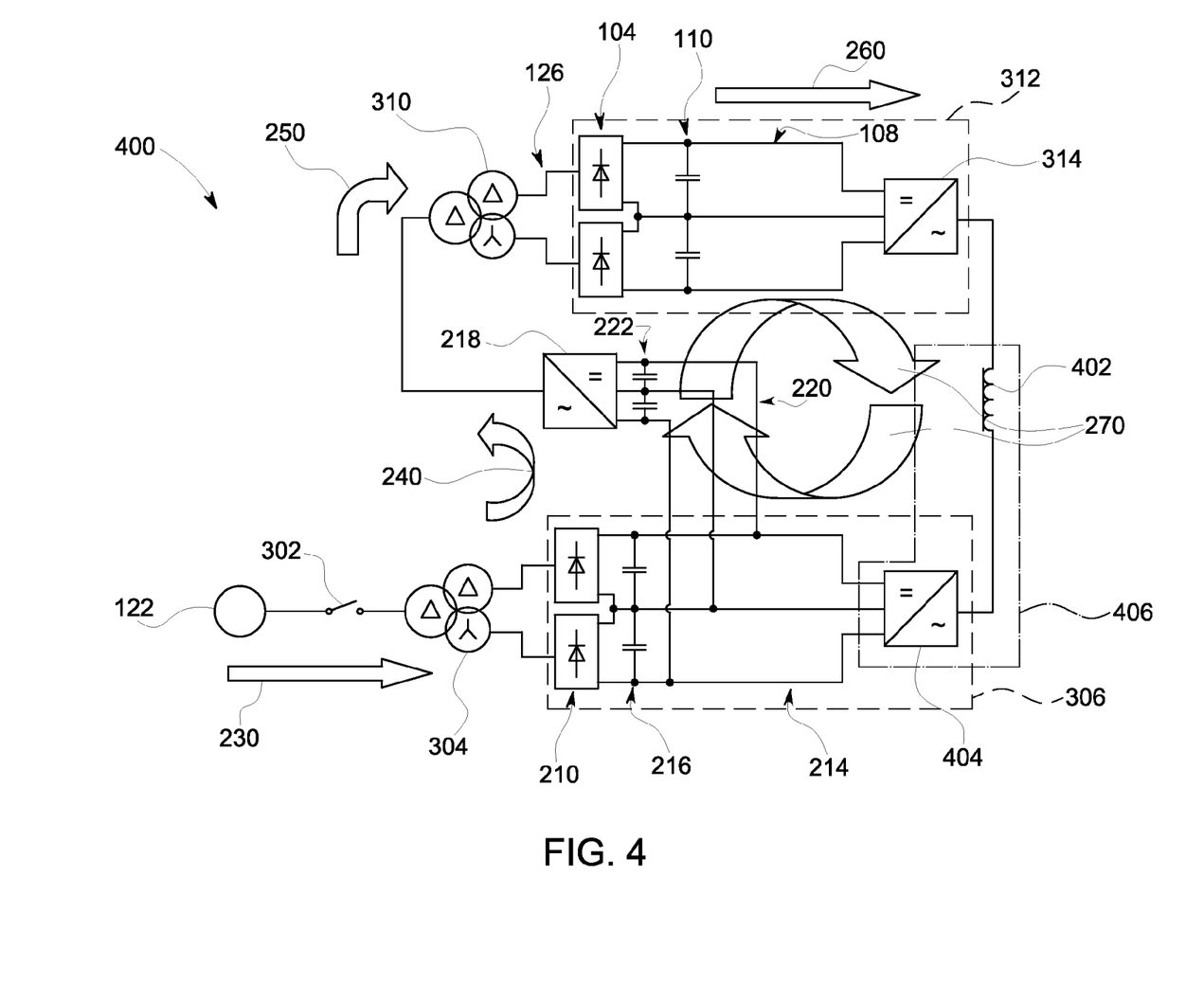
FIG. 4 is a schematic view of another alternative full-power converter assembly testing apparatus.

FIG. 4 is a schematic view of another alternative full-power converter assembly testing apparatus 400. Apparatus 400 is substantially similar to testing apparatus 300 (shown in FIG. 3) with the exception that apparatus 400 includes a low-frequency inductive coupling device $L_{lf}$ 402 and a low-frequency inverter portion 404 that define a virtual machine 406. Virtual machine 406 is controlled and modulated to simulate a load on full-power converter assembly 312. Alternatively, some embodiments of testing apparatus 400 may include an optional LPF unit similar to LPF unit 224 (shown in FIG. 2). Also, alternatively, some embodiments of testing apparatus 400 may include a voltage modulation device similar to voltage modulation device 204 (shown in FIG. 2).

Figure 5:
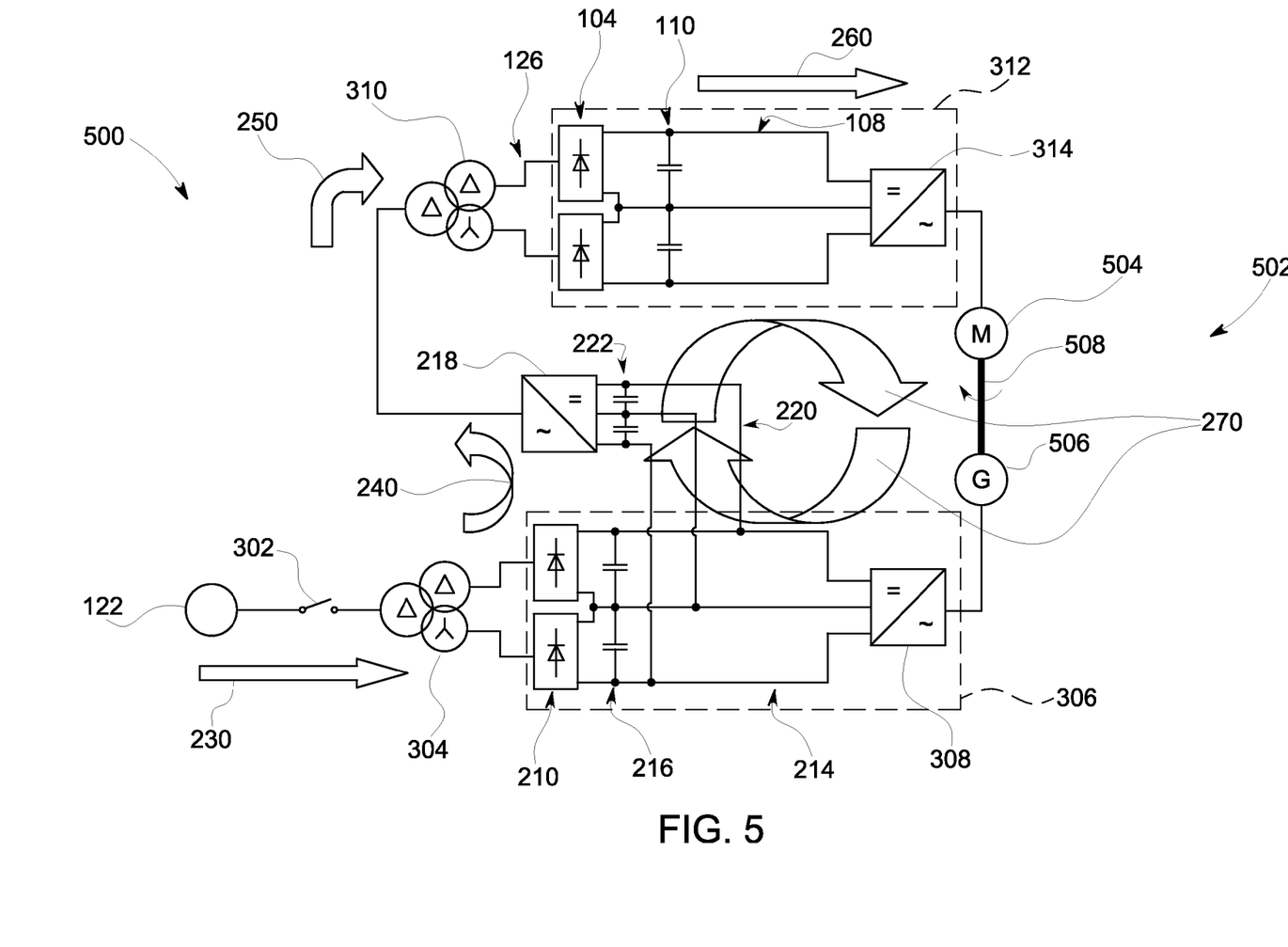
FIG. 5 is a schematic view of yet another alternative full-power converter assembly testing apparatus.

FIG. 5 is a schematic view of yet another alternative full-power converter assembly testing apparatus 500. Apparatus 500 is substantially similar to apparatus 400 (shown in FIG. 4) with the exception that apparatus 500 does not include low-frequency inductive coupling device $L_{lf}$ 402 and low-frequency inverter portion 404 to define virtual machine 406 (all shown in FIG. 4). Rather, apparatus 500 includes a machine 502 that, in this alternative exemplary embodiment, is a motor-generator. Machine 502 includes a motor 504 rotatably coupled to a generator 506 via a shaft 508. Machine 502 is controlled and modulated to establish loads on full-power converter assembly 312. Alternatively, some embodiments of testing apparatus 500 may include an optional LPF unit similar to LPF unit 224 (shown in FIG. 2). Also, alternatively, some embodiments of testing apparatus 500 may include a voltage modulation device similar to voltage modulation device 204 (shown in FIG. 2).

Alternative embodiments of full-power converter assembly testing apparatus 200, 300, 400, and 500 (shown in FIGS. 2, 3, 4, and 5, respectively) are modified to test regenerative full-power converters (not shown). Such regenerative full-power converters include an active front end similar to AFE 218 (shown in FIGS. 2, 3, 4, and 5) in place of rectifier 104 (shown in FIGS. 2, 3, 4, and 5). Power flows 250, 260, and 270 (all shown in FIGS. 2, 3, 4, and 5) may then be transmitted in both directions. Such a regenerative full-power converter may be used to test braking operation of industrial drive trains and converters used for renewable energy sources, for example, wind turbines.

Figure 6:
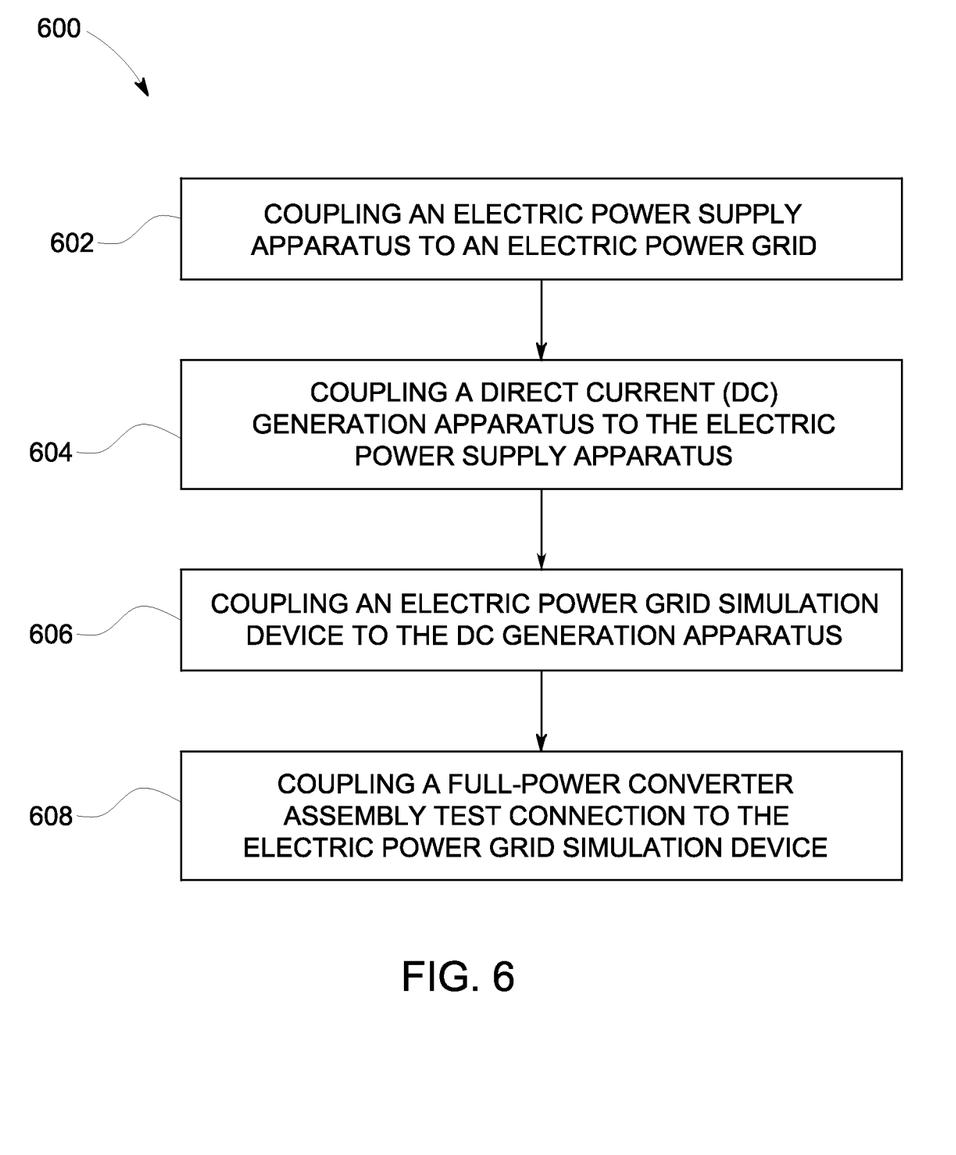
FIG. 6 is a flow chart illustrating an exemplary method that may be used in assembling the full-power converter assembly testing apparatus shown in FIGS. 2, 3, 4, and 5.

FIG. 6 is a flow chart illustrating an exemplary method 600 that may be used in assembling full-power converter assembly testing apparatus 200 (shown in FIG. 2). In the exemplary embodiment, an electric power supply apparatus, i.e., circuit breaker 202, voltage modulation device 204, and power transformer 206 (all shown in FIG. 2) is coupled 602 to electric power grid 122. A DC generation apparatus, i.e., rectifier portion 210 (shown in FIG. 2) is coupled 604 to an electric power supply apparatus, i.e., power transformer 206. An electric power grid simulation device, i.e., AFE 218 (shown in FIG. 2) is coupled 606 to rectifier portion 210. Full-power converter assembly test connection 126 (shown in FIG. 2) is coupled 608 to AFE 218.

Figure 7:
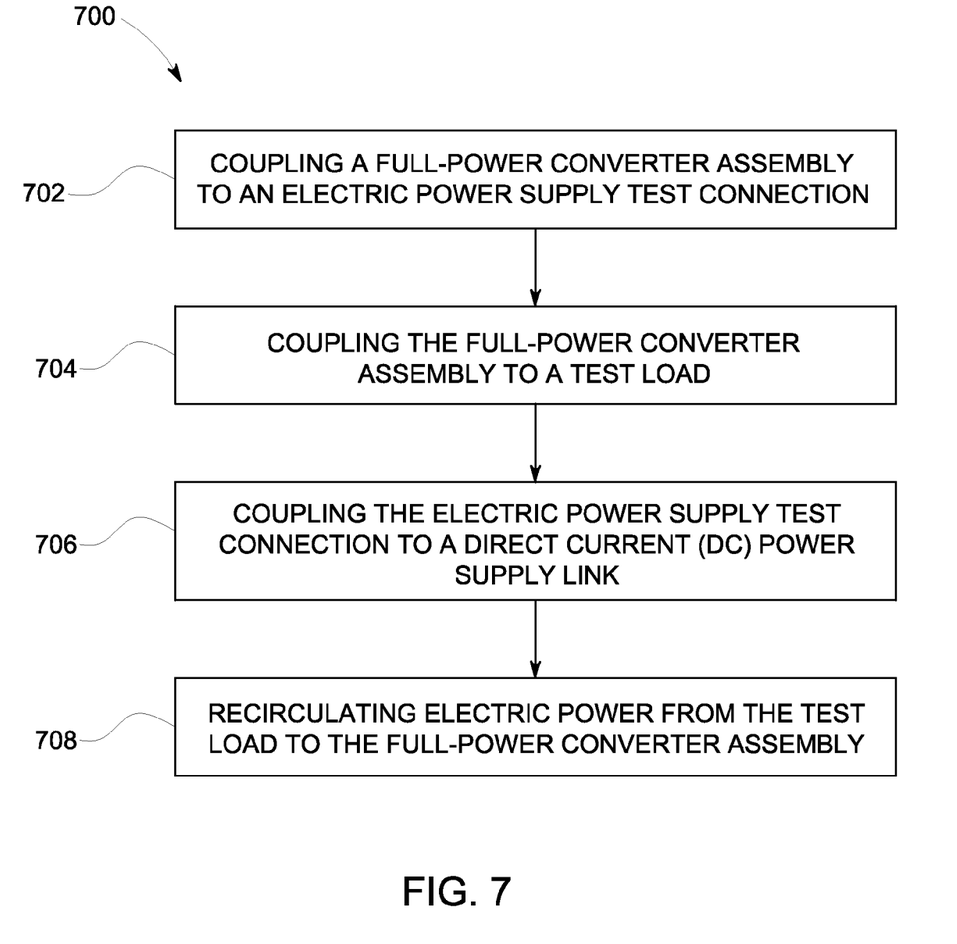
FIG. 7 is a flow chart illustrating an exemplary method that may be used in testing a full-power converter assembly using the full-power converter assembly testing apparatus shown in FIGS. 2, 3, 4, and 5.

FIG. 7 is a flow chart illustrating an exemplary method 700 that may be used in testing full-power converter assembly 102 (shown in FIG. 2) using testing apparatus 200 (shown in FIG. 2). In the exemplary embodiment, full-power converter assembly 102 is coupled 702 to electric power supply test connection 126 and 128 (both shown in FIG. 2). Full-power converter assembly 102 is coupled 704 to a test load, i.e., VFTD 208 (shown in FIG. 2). Electric power supply test connection 126 is coupled 706 to DC link 220 (shown in FIG. 2). Electric power is recirculated 708 from VFTD 208 to full-power converter assembly 102.

The above-described power converter testing apparatus provides a cost effective and reliable method for increasing efficiency and performance of power converter testing apparatus during testing operations. Specifically, the power converter testing apparatus facilitates increasing the operating efficiency of the testing operations by facilitating use of a direct current (DC) link between an alternating current (AC) source and an AC test supply device that simulates a utility grid electric power supply to the apparatus being tested. Specifically, the power converter testing apparatus recirculates electric power in an internal loop rather than through a second utility grid connection, thereby eliminating the second utility grid connection. Further, specifically, the power converter testing apparatus uses the single utility grid connection to merely transmit initial testing power and to replenish electric power that has dissipated in the electric power recirculation loop. Therefore, using the single utility grid connection merely as an initial and make-up power source facilitates a reduction in the size of otherwise large electric power transmission devices, such as, electric power transformers and utility grid isolation circuit breakers. Also, use of a single utility grid connection facilitates a reduction in the number of such electric power transformers and utility grid isolation circuit breakers. Moreover, since the power converter testing apparatus eliminates recirculating electric power back to the utility grid, the apparatus facilitates a reduction of induced electrical disturbances to the utility grid, such as, induced harmonics, thereby facilitating a reduction in the size and number of filtering equipment interfacing the utility grid and the testing apparatus. Furthermore, since the apparatus is substantially isolated from the utility grid, testing the power converters using a range of frequencies, voltages, and power factors is facilitated.

Exemplary embodiments of systems and methods for testing a full-power converter assembly are described above in detail. The system and methods are not limited to the specific embodiments described herein, but rather, components of systems and/or steps of the method may be utilized independently and separately from other components and/or steps described herein. For example, the systems and methods may also be used in combination with other electrical systems and methods, and are not limited to practice with only the power converter testing apparatus as described herein. Rather, the exemplary embodiment can be implemented and utilized in connection with many other electrical system and testing applications.

Although specific features of various embodiments of the invention may be shown in some drawings and not in others, this is for convenience only. Moreover, references to "one embodiment" in the above description are not intended to be interpreted as excluding the existence of additional embodiments that also incorporate the recited features. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of assembling a testing apparatus for a full-power converter assembly, said method comprising:
    coupling an electric power supply apparatus to an electric power grid;
    coupling a rectifier apparatus to the electric power supply apparatus;
    coupling an electric power grid simulation device directly to the rectifier apparatus;
    coupling a variable frequency drive (VFD) device directly to the rectifier apparatus and configuring the VFD as a simulated machine load; and
    coupling a full-power converter assembly test connection to the electric power grid simulation device.

2. A method in accordance with claim 1, wherein coupling an electric power supply apparatus to an electric power grid comprises coupling a variable ratio transformer to the electric power grid.

3. A method in accordance with claim 1, wherein coupling an electric power grid simulation device directly to the rectifier apparatus comprises coupling a frequency control device directly to the rectifier apparatus.

4. A method in accordance with claim 3, further comprising coupling a low pass filter to the frequency control device.

5. A method in accordance with claim 1 further comprising coupling the variable frequency drive device to at least one of:
    an inductive high-frequency coupling device;
    an inductive low-frequency coupling device; and
    a motor-generator unit.

6. A testing apparatus for a full-power converter assembly comprising:
    a utility grid electric power supply apparatus;
    a rectifier apparatus coupled to said utility grid electric power supply apparatus;
    an electric power grid simulation device directly coupled to said rectifier apparatus;
    a variable frequency drive device directly coupled to said rectifier apparatus and configured as a simulated machine load; and
    a full-power converter assembly test connection coupled to said electric power grid simulation device.

7. A testing apparatus in accordance with claim 6, wherein said utility grid electric power supply apparatus comprises a variable ratio transformer.

8. A testing apparatus in accordance with claim 6, wherein said electric power grid simulation device comprises an active front end frequency control device.

9. A testing apparatus in accordance with claim 6, wherein said electric power grid simulation device comprises a low pass filter.

10. A testing apparatus in accordance with claim 6 further comprising at least one of:
    an inductive high-frequency coupling device;
    an inductive low-frequency coupling device; and
    a motor-generator unit.

11. A method of testing a full-power converter assembly, said method comprising:
    coupling a full-power converter assembly to an electric power supply test connection;
    coupling the full-power converter assembly to a test load;
    coupling a rectifier apparatus to an electric power grid;
    coupling an electric power grid simulation device to the electric power supply test connection and directly to the rectifier apparatus: and
    coupling the electric power supply test connection to an electric power grid and the test load directly to the rectifier apparatus; and
    recirculating electric power from the test load to the full-power converter assembly via the electric power supply test connection such that the recirculated electric power bypasses the electric power grid.

12. A method in accordance with claim 11, wherein recirculating electric power from the test load to the full-power converter assembly comprises injecting alternating current (AC) power from an electric power grid into the DC power supply link to make up for electric power recirculation losses therein.

13. A method in accordance with claim 11, wherein recirculating electric power from the test load to the full-power converter assembly comprises transmitting DC power from the test load to the electric power grid simulation device.

14. A method in accordance with claim 13, wherein transmitting DC power from the test load to an electric power grid simulation device comprises: substantially rectifying AC power transmitted from the full-power converter assembly to DC power; and transmitting the DC power to a frequency control device.

15. A method in accordance with claim 11, wherein recirculating electric power from the test load to the full-power converter assembly comprises modulating a voltage of the electric power transmitted to the full-power converter assembly comprising modulating a voltage on a DC power supply link by at least one of:
    modulating a voltage of AC power transmitted from the electric power grid; and modulating a voltage of a variable frequency drive device operating as a test load.

16. A method in accordance with claim 11, wherein recirculating electric power from the test load to the full-power converter assembly comprises modulating a frequency of the electric power transmitted to the full-power converter assembly comprising at least one of:
   modulating a frequency control device; and
   transmitting the electric power through a low pass filter.

* * * * *